(12) United States Patent
Yu et al.

(10) Patent No.: US 9,793,105 B1
(45) Date of Patent: Oct. 17, 2017

(54) FABRICATING METHOD OF FIN FIELD EFFECT TRANSISTOR (FINFET)

(71) Applicant: UNITED MICROELECTRONICS CORPORATION, Hsinchu (TW)

(72) Inventors: Chun-Wei Yu, Tainan (TW); Hsu Ting, Tainan (TW); Chueh-Yang Liu, Tainan (TW); Yu-Ren Wang, Tainan (TW); Kuang-Hsiu Chen, Tainan (TW); Yi-Liang Ye, Kaohsiung (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 13 days.

(21) Appl. No.: 15/225,829

(22) Filed: Aug. 2, 2016

(51) Int. Cl.
H01L 21/02 (2006.01)
H01L 21/306 (2006.01)
H01L 21/8234 (2006.01)
H01L 29/66 (2006.01)
H01L 27/088 (2006.01)

(52) U.S. Cl.
CPC ......... *H01L 21/02063* (2013.01); *H01L 21/823418* (2013.01); *H01L 21/823431* (2013.01); *H01L 21/823437* (2013.01); *H01L 21/823468* (2013.01); *H01L 27/0886* (2013.01); *H01L 29/6653* (2013.01)

(58) Field of Classification Search
CPC ....... H01L 21/02063; H01L 21/823431; H01L 21/823418; H01L 21/823437; H01L 21/823468; H01L 29/6653; H01L 27/0886
See application file for complete search history.

(56) References Cited

U.S. PATENT DOCUMENTS

| 6,165,279 | A | 12/2000 | Tsao et al. |
| 7,776,755 | B2* | 8/2010 | Lin ............... H01L 21/0206 134/1.2 |
| 8,440,517 | B2 | 5/2013 | Lin et al. |
| 8,809,139 | B2 | 8/2014 | Huang et al. |
| 2004/0129967 | A1* | 7/2004 | Kim ............ H01L 27/10817 257/306 |
| 2005/0115671 | A1* | 6/2005 | Araki ................ B08B 7/04 156/345.12 |
| 2005/0139231 | A1 | 6/2005 | Abadie et al. |
| 2008/0124909 | A1* | 5/2008 | Lee ................. C11D 3/3947 438/595 |

(Continued)

*Primary Examiner* — Savitr Mulpuri
(74) *Attorney, Agent, or Firm* — Ding Yu Tan

(57) ABSTRACT

The invention provides a fabricating method of a FinFET, comprising: providing a substrate having fin structures; depositing an dielectric layer on the substrate filling between the fin structures; forming recesses to reveal a portion of the fin structure by removing a portion of the dielectric layer; performing a cleaning process on using a cleaning solution selected from one of a first solution, consisting of dHF and $H_2O_2$, and a second solution, consisting of dHF and $DIO_3$; forming a gate structure across on the fin structures; and forming a source/drain structure on the substrate at two lateral sides of the gate structure. The present invention also provides a fabricating method of a FinFET having an improved cleaning step using a cleaning solution having one of a third solution, consisting of dHF and $DIO_3$, and a fourth solution, consisting of $NH_4OH$ and $DIO_3$ before formation of the source/drain structure.

20 Claims, 13 Drawing Sheets

(56) References Cited

U.S. PATENT DOCUMENTS

| | | | |
|---|---|---|---|
| 2010/0003793 A1* | 1/2010 | Jung | H01L 21/02068 |
| | | | 438/197 |
| 2010/0099258 A1* | 4/2010 | Hoh | H01L 21/76814 |
| | | | 438/689 |
| 2014/0130825 A1 | 5/2014 | Brown | |
| 2015/0000704 A1* | 1/2015 | Yeh | C11D 7/06 |
| | | | 134/19 |
| 2016/0035861 A1* | 2/2016 | Park | H01L 29/66545 |
| | | | 438/301 |

* cited by examiner

FABRICATING METHOD OF FIN FIELD EFFECT TRANSISTOR (FINFET)

FIELD OF THE INVENTION

The present invention relates to a fabricating method of a FinFET, especially one which includes an improved cleaning process.

BACKGROUND OF THE INVENTION

The semiconductor industry has experienced exponential growth. Technological advances in semiconductor materials and designs have produced generations where each generation has smaller scales and/or higher product performances than the previous generation. In order to achieve these high densities and high product performances, a more accurate manufacturing process is required, and most importantly, higher demands on cleaning results and cleaning efficiency in the fabricating process are then desired.

In a conventional manufacturing process, a cleaning process is performed to remove particles and residues. The cleaning process is very critical to the whole manufacturing process, and for cleaning effectivity, cleaning solutions are also light etching solutions to the cleaning surface of a substrate. However, it is difficult to have sufficient etching ratio of a cleaning solution for better cleaning efficiency at the meanwhile or same time without increasing a loss amount of the material of the substrate and/or materials formed on the substrate, and it leads to bad uniformity of the surface after a cleaning process. And thereby performances of the products are affected and product yields decreases.

Therefore, how to improve cleaning processes performed in a semiconductor manufacturing process, especially a FinFET fabricating process as the miniaturization trends of the semiconductor devices, becomes the subject of the present invention.

SUMMARY OF THE INVENTION

The present invention provides a fin field effect transistor (FinFET), comprising: providing a substrate; forming a plurality of fin structures by removing a portion of the substrate; depositing an dielectric layer on the substrate filling between the fin structures; forming a plurality of recesses to reveal a portion of the fin structure by removing a first portion of the dielectric layer; performing a cleaning process on the fin structures and the dielectric layer using a cleaning solution selected from one of a first solution and a second solution, wherein the first solution consists of dilute hydrogen fluoride and hydrogen peroxide and the second solution consists of dilute hydrogen fluoride and ozonated deionized water; forming a gate structure on the fin structures, wherein an extending direction of the gate structure is perpendicular to an extending direction of the fin structures; and forming a source/drain structure on the substrate at two lateral sides of the gate structure.

In one embodiment of the present invention, wherein a duration time of the step of performing the cleaning process is in a range of 10~80 seconds.

In one embodiment of the present invention, wherein the cleaning process removes a second portion of the dielectric layer and a thickness of the dielectric layer is reduced by less than 10 angstroms.

In one embodiment of the present invention, wherein the dilute hydrogen fluoride in the first solution is 300:1~2000:1 diluted.

In one embodiment of the present invention, wherein the dilute hydrogen fluoride in the second solution is 300:1~2000:1 diluted.

In one embodiment of the present invention, wherein a weight ratio of the dilute hydrogen fluoride to the ozonated deionized water in the second solution is in a range of 1:1~1:10.

In one embodiment of the present invention, wherein a weight ratio of the dilute hydrogen fluoride to the hydrogen peroxide in the first solution is in a range of 1:1~1:10.

In one embodiment of the present invention, wherein the cleaning process is performed directly after the step of forming the recesses.

In one embodiment of the present invention, wherein the step of forming the gate structure comprises: directly after the cleaning process, forming a gate oxide covering the fin structures; forming a gate electrode on the gate oxide; and patterning the gate oxide and the gate electrode into the gate structures.

In one embodiment of the present invention, wherein a precursor oxide is formed on the fin structures in the cleaning process.

On another aspect, the present invention provides a fabricating method of a fin field effect transistor (FinFET), comprising: providing a substrate; forming a plurality of fin structures by removing a portion of the substrate; forming a gate structure on the fin structure, wherein an extending direction of the gate structure is perpendicular to an extending direction of the fin structures; forming a plurality of recesses by removing a portion of the fin structures at two lateral sides of the gate structure; performing a first cleaning step on the substrate, using a cleaning solution having one of a third solution and a fourth solution, wherein the third solution consists of dilute hydrogen fluoride and ozonated deionized water, and the fourth solution consists of ammonium hydroxide and ozonated deionized water; and forming a source/drain structures in the source/drain recesses by epitaxial growth.

In one embodiment of the present invention, wherein a duration time of the step of the first cleaning step is in a range of 5~120 seconds.

In one embodiment of the present invention, after the step of forming the gate structure before the step of forming the plurality of recesses, the method further comprises: forming a mask layer conformally covering the fin structures and the gate structures.

In one embodiment of the present invention, in the step of forming the plurality of recesses, wherein a portion of the mask layer is removed to form a spacer on lateral sides of the gate structure.

In one embodiment of the present invention, wherein a portion of the spacer is removed in the step of performing the first cleaning step, and a thickness of the substrate is reduced by less than 100 angstroms.

In one embodiment of the present invention, wherein a portion of the substrate is removed in the step of performing the first cleaning step, and a thickness of the substrate is reduced by less than 30 angstroms.

In one embodiment of the present invention, after the first cleaning step before the step of forming a source/drain structures, the method further comprises: performing a second cleaning step using a SC1 solution.

In one embodiment of the present invention, wherein a weight ratio of the dilute hydrogen fluoride to the ozonated deionized water in the third solution is in a range of 1:1~1:10.

In one embodiment of the present invention, wherein a weight ratio of the ammonium hydroxide to the ozonated deionized water in the fourth solution is in a range of 1:1~1:10.

In one embodiment of the present invention, wherein the first cleaning step is performed under a temperature condition in a range of 25~90 degree Celsius.

Accordingly, the present invention provides a fabricating method of a FinFET including an improved cleaning process before gate oxide formation, which can effectively remove particles/residues from the previous process and at the same time has very limited removal rate to the materials of and/or on the substrate, and at the same time, a precursor oxide can also be formed in the same cleaning process that not only provides better uniformity of the gate oxide formed thereof but also avoid another pre-cleaning step. Moreover, the present invention also provides another improved cleaning process (i.e. the first and the second cleaning steps) before the formation of source/drain structures that not just provides better cleaning result (especially with better removal efficiency to polymer and halogen residues) but also minimizes loss amount of silicon substrate and nitride spacers, and therefore it provides better product yields. The two cleaning processes can be used alone to have an improved result or together to even improve product yields and lower down fabrication and material cost.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention provides a fabricating method of a FinFET including an improved cleaning process, which can effectively remove particles/residues from the previous process and at the same time has very limited removal rate to the materials of and/or on the substrate. The method provided by the present invention can efficiently remove particles/residues without affecting the processes later on, and the present invention can thereby improve product yields and performances of the products. It is to be noted that the following descriptions of preferred embodiments of this invention are presented herein for purpose of illustration and description only but not intended to be exhaustive or to be limited to the precise form disclosed.

In the following illustration, the element arranged repeatedly is described in word "one", "a" or "an" for simpler explanation. However, one skilled in the art should understand the practical structure and arrangement of each element based on the following illustration and figures provided in the present application.

Figure 1:
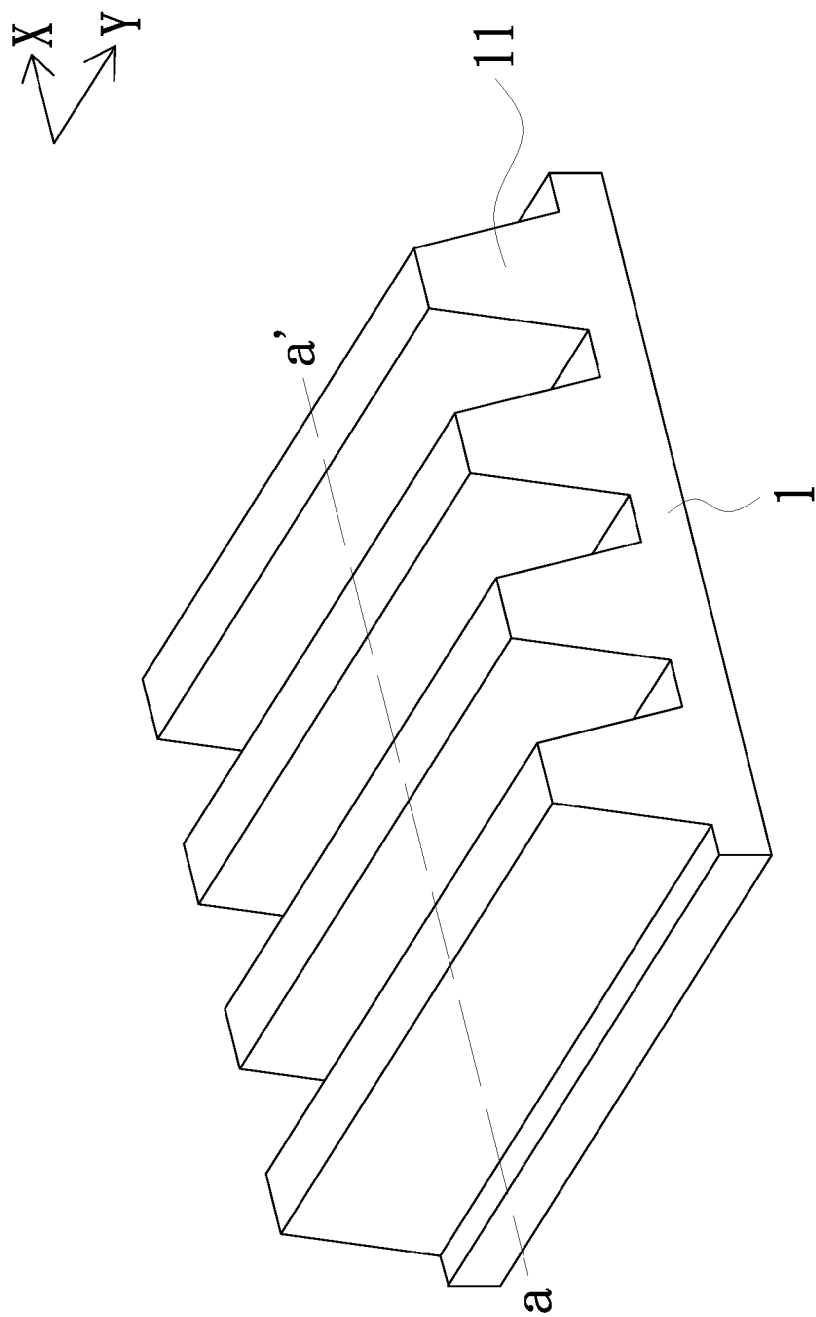
FIG. 1 is a top structural view of a fabricating step according to an embodiment of the present invention.
Figure 1A:
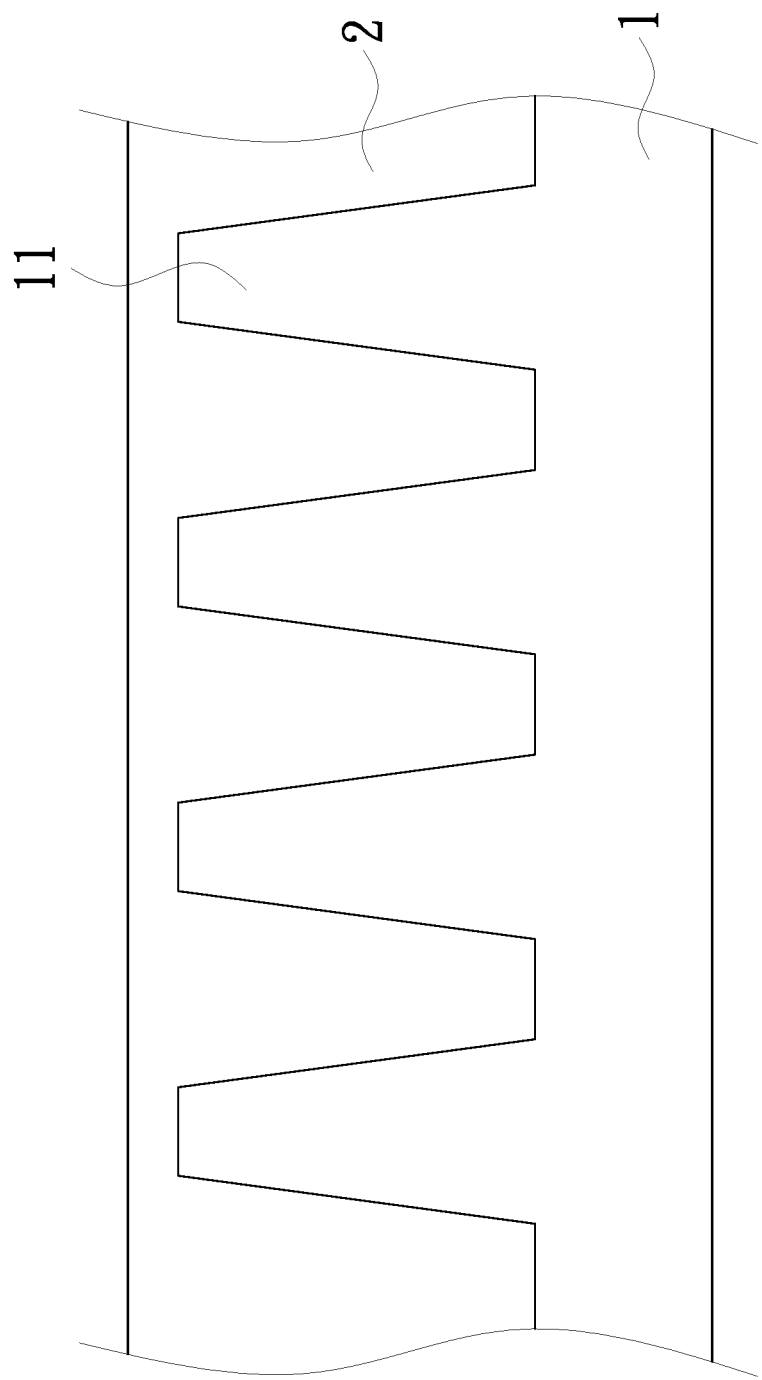
FIGS. 1a-1c are cross-sectional views of different steps along the line a-a' in FIG. 1 after the step as shown in FIG. 1 according to an embodiment of the present invention.
Figure 1B:
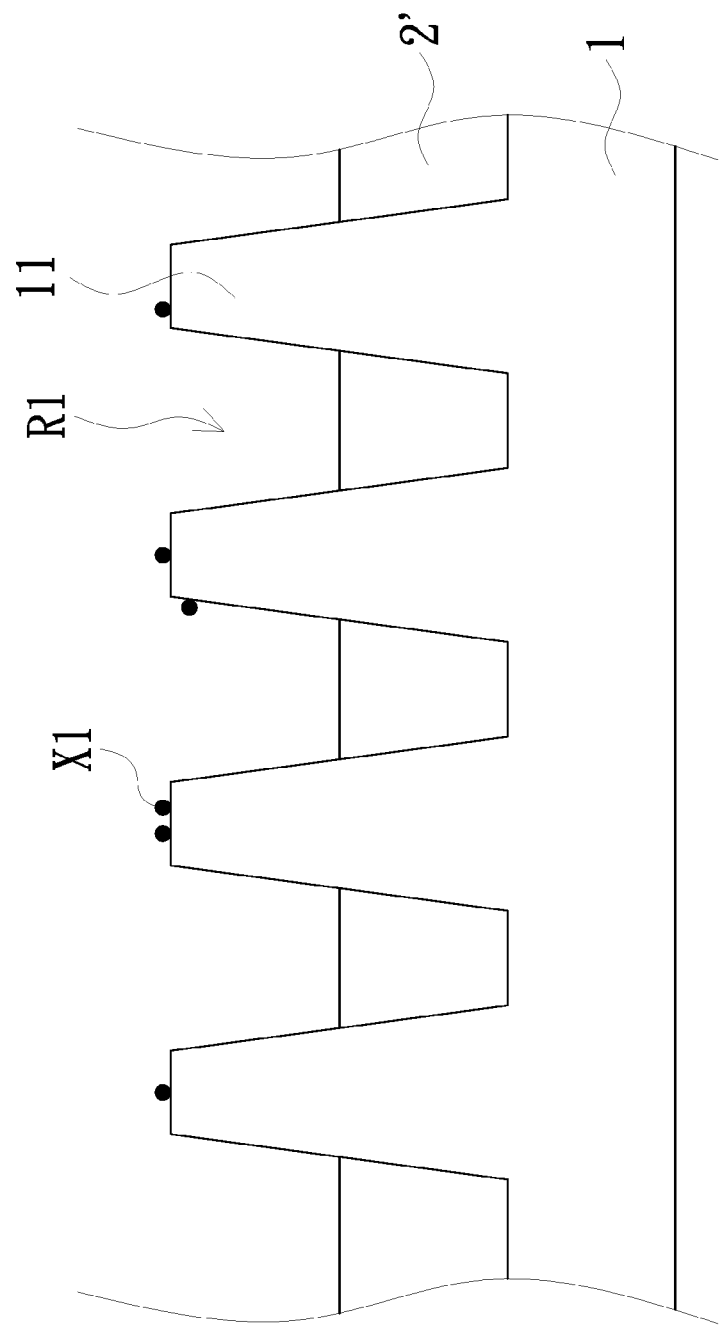
Figure 1C:
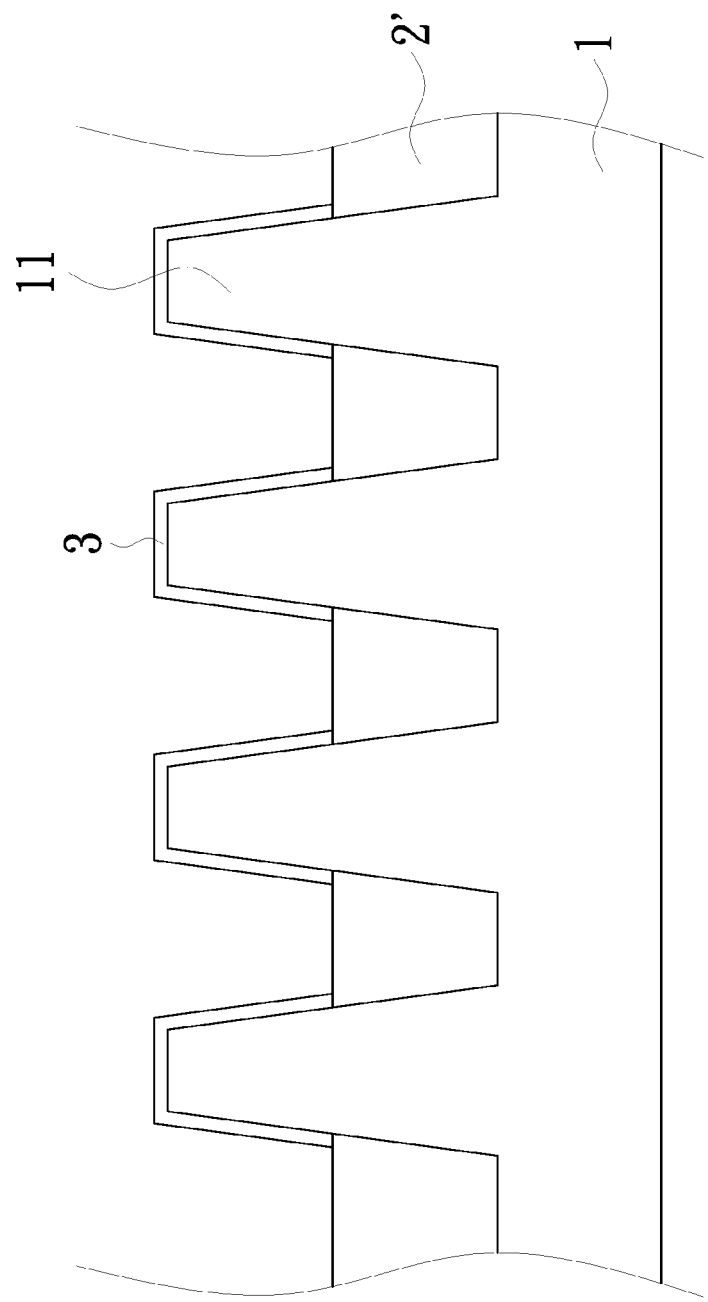

As shown in FIG. 1, a substrate 1 having a plurality of fin structures 11 is provided. The plurality of fin structures 11 can be formed by removing a portion of the substrate 1 via a dry etching process. FIGS. 1a-1c are cross-sectional views taken along the line a-a' in FIG. 1 of different steps for better illustration of the following steps. Material of the substrate 1 is silicon in an embodiment of the present invention. As shown in FIG. 1a, a dielectric layer 2 is deposited covering the entire substrate 1 filling between the fin structures 11. The deposition of the dielectric layer 2 can be performed by FCVD (flowable chemical vapor deposition) for better uniformity and planar result. And then as shown in FIG. 1b, an etching back process (e.g. a dry etching process) is performed to form a dielectric layer 2' and a plurality of recesses R1 by removing a portion of the dielectric layer 2 to reveal a (top) portion of the plurality of fin structures 11. Usually, byproduct X1 is formed and attached on the revealed portion of the fin structures 11 and/or the dielectric layer 2' after the etching back process (FIG. 1b only shows byproduct X1 attached on the fin structures 11).

Then a cleaning process is performed on the fin structures 11 and the dielectric layer 2' using a cleaning solution selected from one of a first solution and a second solution. The first solution of the present invention uses FPM solution, consisting of dilute hydrogen fluoride (dHF) and hydrogen peroxide ($H_2O_2$), wherein the dHF in the first solution is 300:1~2000:1 diluted, and a weight ratio of the dHF to the $H_2O_2$ in the first solution is in a range of 1:1~1:10; and the second solution of the present invention uses FOM solution, consisting of dHF and ozonated deionized water ($DIO_3$), wherein the dHF in the second solution is also 300:1~2000:1 diluted, and a weight ratio of the dHF to the $DIO_3$ in the second solution is in a range of 1:1~1:10.

A duration time of the cleaning process is in a range of 10~80 seconds, and preferably in a range of 10~60 seconds. As compared to conventional cleaning process, the cleaning process of the present invention herein also has a light etching rate to the dielectric layer 2' for better cleaning result. However, a loss amount of the dielectric layer 2' is very limited and well-controlled in the present invention. In an embodiment of the present invention, the cleaning process further removes a second portion of the dielectric layer 2 (i.e. a portion of the dielectric layer 2') and a thickness of the dielectric layer 2' is reduced by less than 10 angstroms (not shown in figures). Moreover, due to the composition or ingredients of the first or the second solution, oxidation happens on the revealed portion of the silicon fin structures 11. And a precursor oxide 3 as shown in FIG. 1c is formed in the step of the cleaning process as a basis for gate oxide formation later on.

In the conventional process, a post-etching clean and an IO pre-clean are required after an etching process and before gate oxide formation in order to have good cleaning results and better performances of the gate oxide. However, the conventional post-etching cleaning focuses on removing residues without function of precursor oxide formation. In addition, two steps of cleaning process result in a larger loss amount of an isolating layer in-between fin structures, and more specifically, a reduced thickness of the isolating layer before and after the cleaning process is usually more than 20~25 angstroms following the conventional method.

Therefore it leads to higher fin heights control weakness or issues. The cleaning process as illustrated above provided by the present invention can be performed directly after the step of forming the recesses R1. and has advantages of better control of oxide loss and less/fewer manufacturing steps. In addition, good cleaning results and product performances can be obtained as proved by KLA inspection and XPS analysis. The fabricating method provided by the present invention can therefore improve product yields by reducing a fin height control risk and also decrease material and manufacturing cost.

Figure 2:
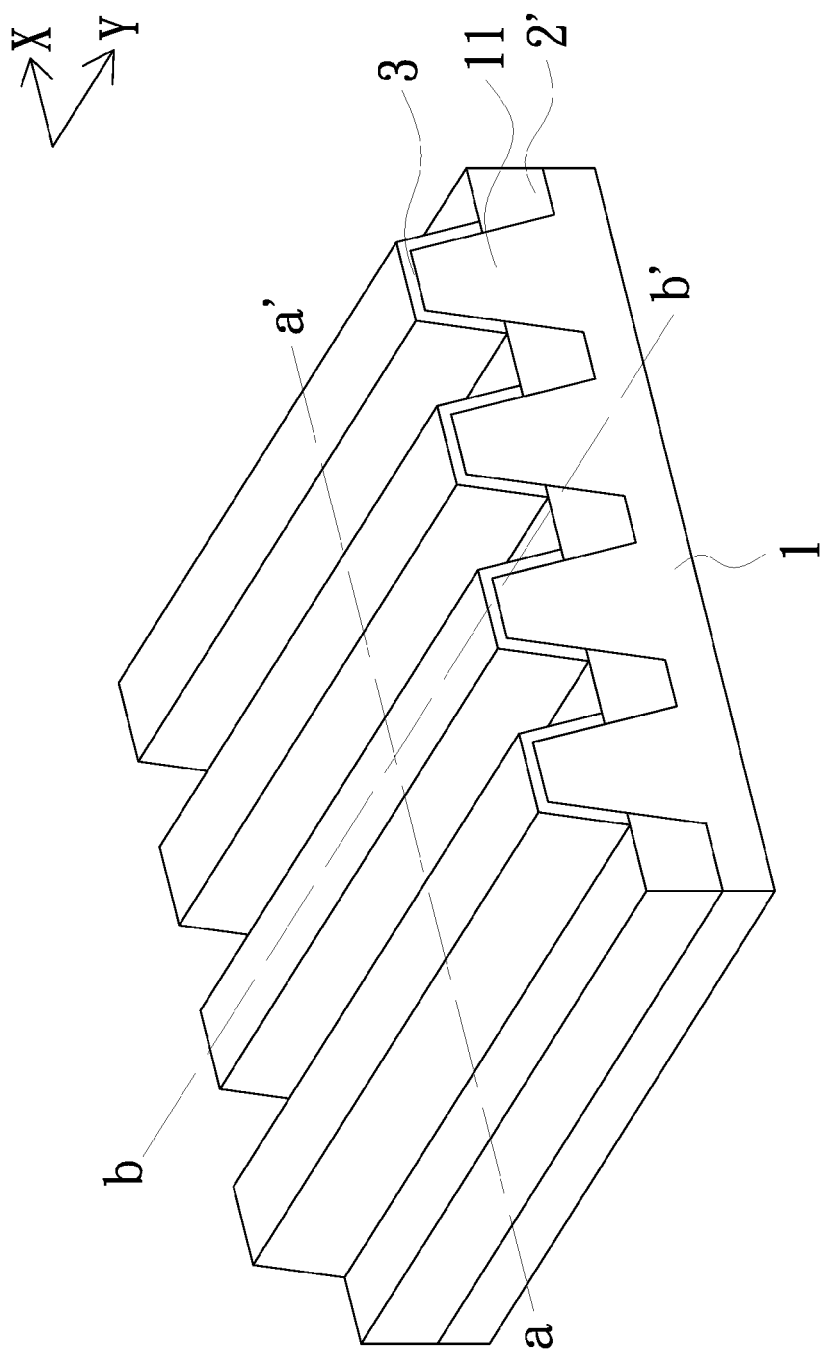
FIG. 2 is a top structural view of the intermediate structure as shown in FIG. 1c.
Figure 2A:
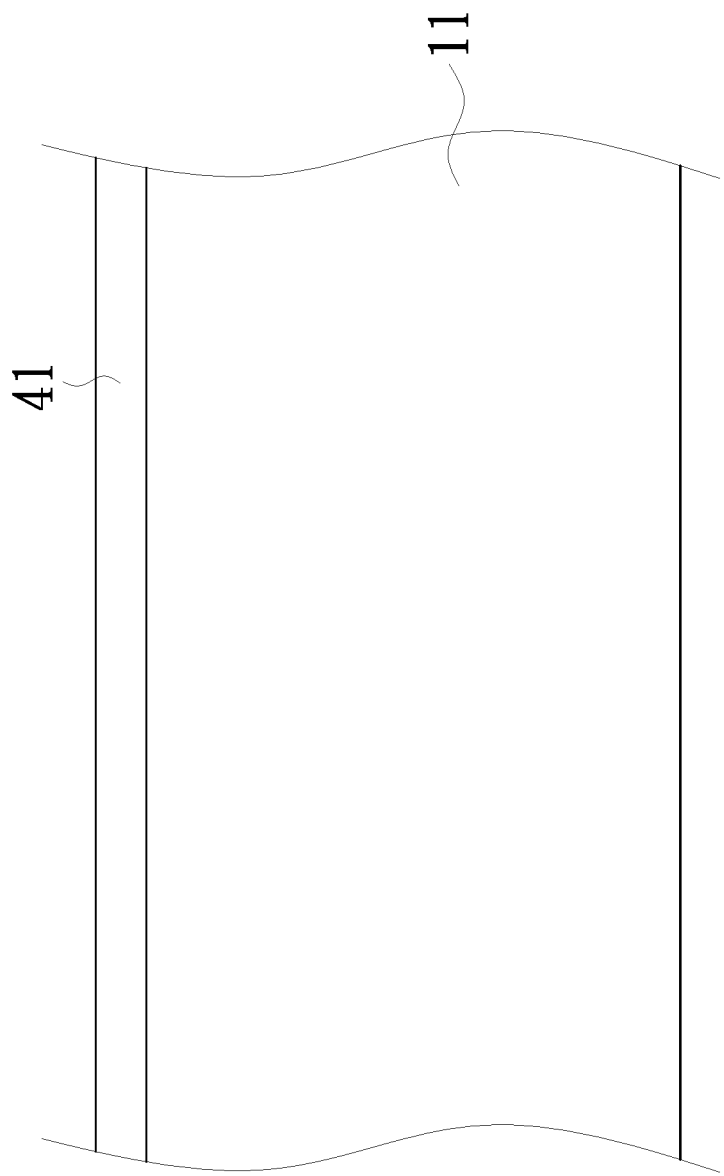
FIGS. 2a-2c are cross-sectional views of different steps along line b-b' in FIG. 2 after the step as shown in FIG. 1c according to an embodiment of the present invention.
Figure 2B:
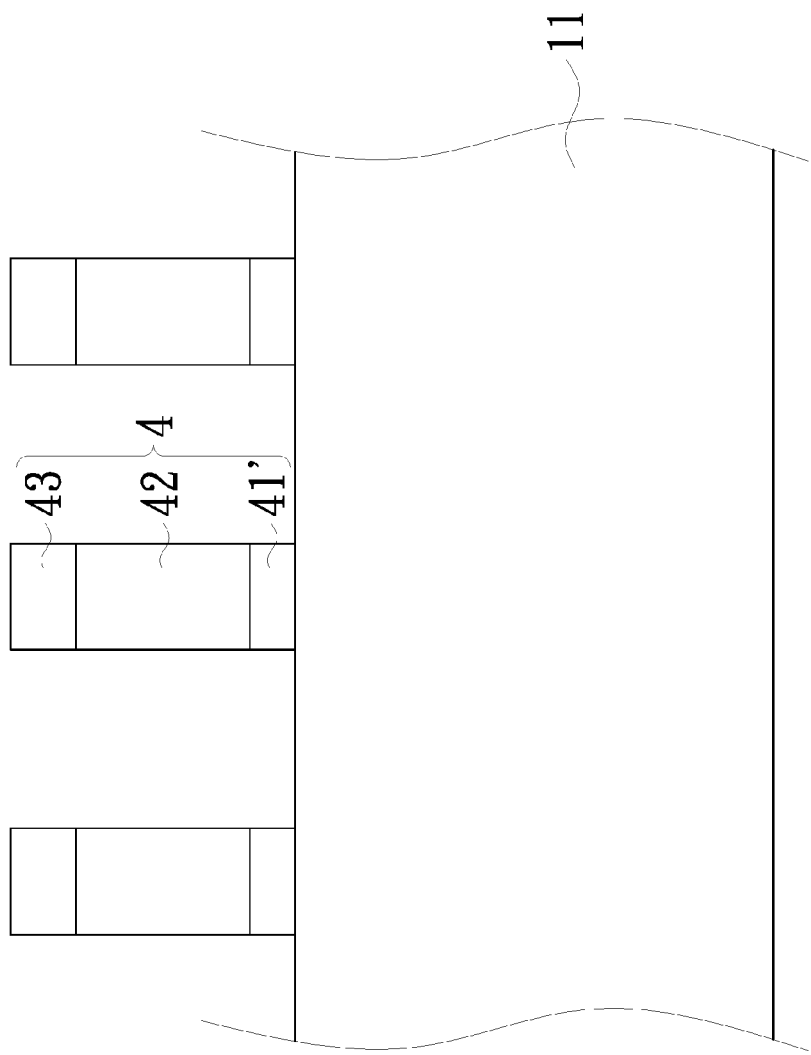
Figure 2C:
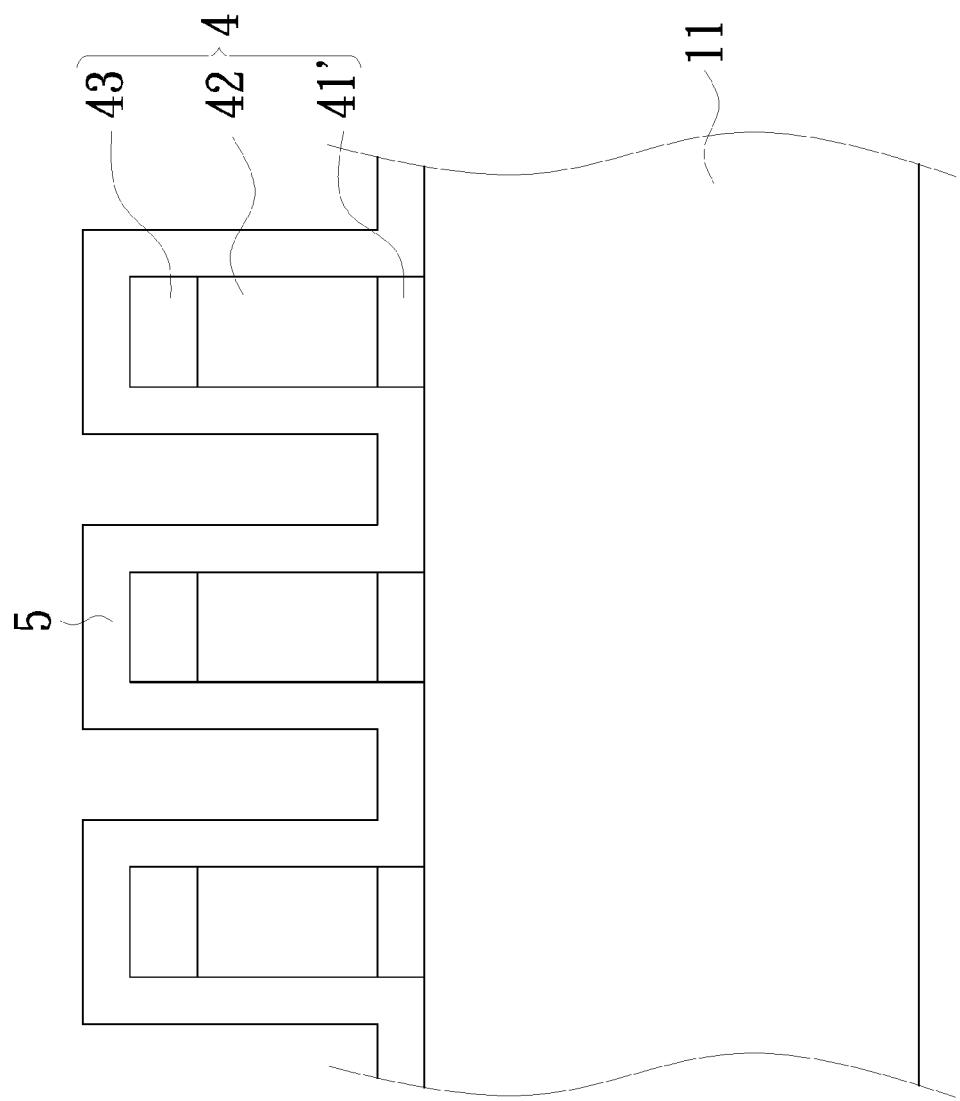

FIG. 2 shows a top structural view of the intermediate structure as shown in FIG. 1c, and the following steps of the fabricating method provided by the present invention are illustrated in FIGS. 2a-2c, which are cross-sectional views taken along line b-b' in FIG. 2 of different steps performed after formation of the precursor oxide 3.

A gate structure is then formed across on the fin structures 11 (i.e. an extending direction of the gate structure is perpendicular to an extending direction of the fin structures 11). Firstly, as shown in FIG. 2a, an oxide layer 41 is formed on the fin structures 11 from the precursor oxide 3. And then an electrode layer and a protecting layer (not shown) are sequentially formed on the substrate 1 covering the fin structures 11 and the oxide layer 41. The protecting layer is only for better protection to the electrode layer underlying, and is optional. Afterward, the protecting layer, the electrode layer, and the oxide layer 41 are patterned in order to form a plurality of gate structures 4 covering across on the fin structures 11 with an extending direction perpendicular to the extending direction of the fin structures 11. Each one of the gate structures 4 comprises a gate oxide 41', a gate electrode 42, and optionally a cap layer 43 as shown in FIG. 2b. The gate electrode 42 and the gate oxide 41' are both covering across the plurality of fin structures 11, wherein an extending direction of the gate electrode 42 is also perpendicular to the extending direction of the fin structures 11. The cap layer 43 is optionally formed on a top of the gate electrode 42 for protection to the gate electrode 42 from damages resulted from the patterning process and etching processes later on in the fabrication. Materials of the gate electrode 42 can be selected from polysilicon or metal; and materials of the cap layer 43 can be selected from oxide, nitride, oxynitride, or combination thereof. In a preferred embodiment, the gate electrode 42 is made of polysilicon, and the cap layer 43 is made of oxide.

Figure 3:
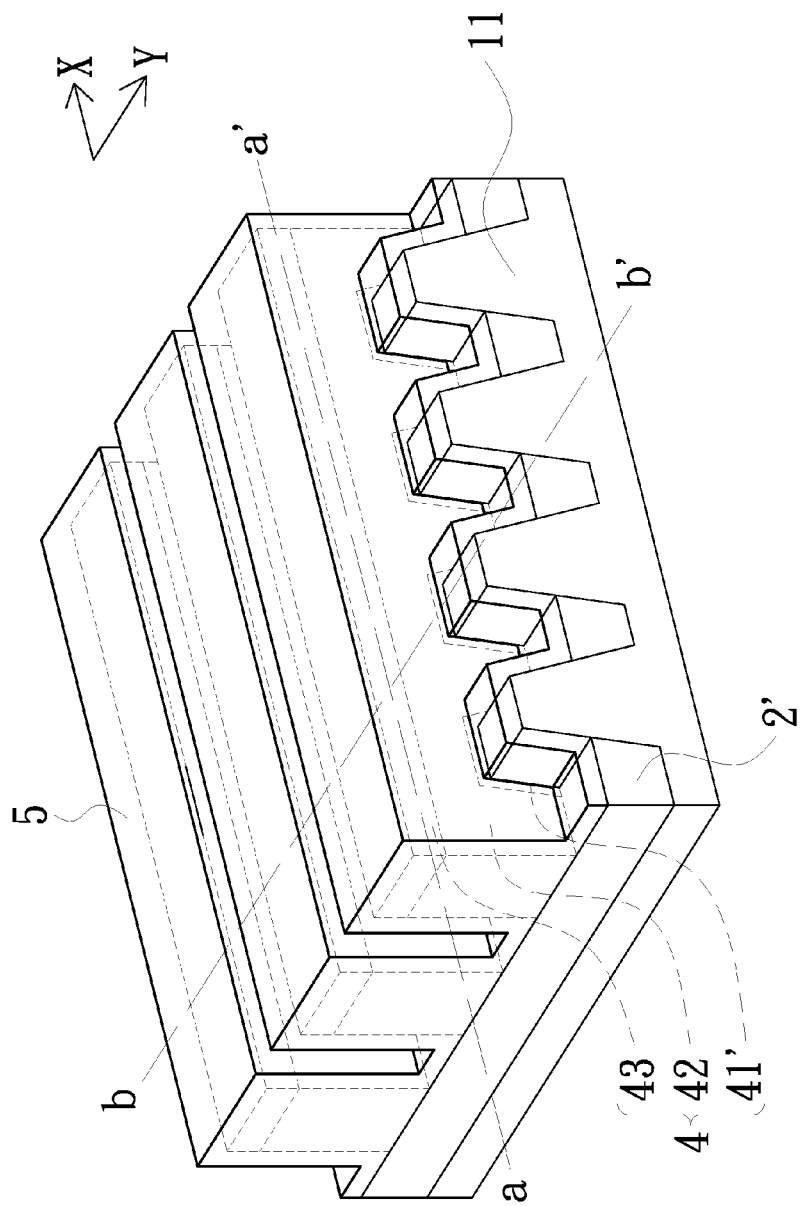
FIG. 3 is a top structural view of the intermediate structure as shown in FIG. 2c.

As shown in FIG. 2c, a mask layer 5 is then conformally formed on the substrate 1 covering the fin structures 11 and the gate structures 4 including the gate oxide 41', the gate electrode 42, and the cap layer 43. The mask layer 5 can be a multi-layer structure, and material of the mask layer 5 is selected from oxide, nitride, oxynitride, and a combination thereof. In an embodiment of the present invention, the mask layer 5 is made of silicon nitride. FIG. 3 is a top structural view of the intermediate structure as shown in FIG. 2c, and relative positions and extending directions of the fin structures 11 to the gate structures 4 are more clearly illustrated in FIG. 3. In a preferred embodiment, the mask layer 5 is a bi-layer structure formed by firstly deposited an oxide sub-layer and then a nitride sub-layer.

Figure 3A:
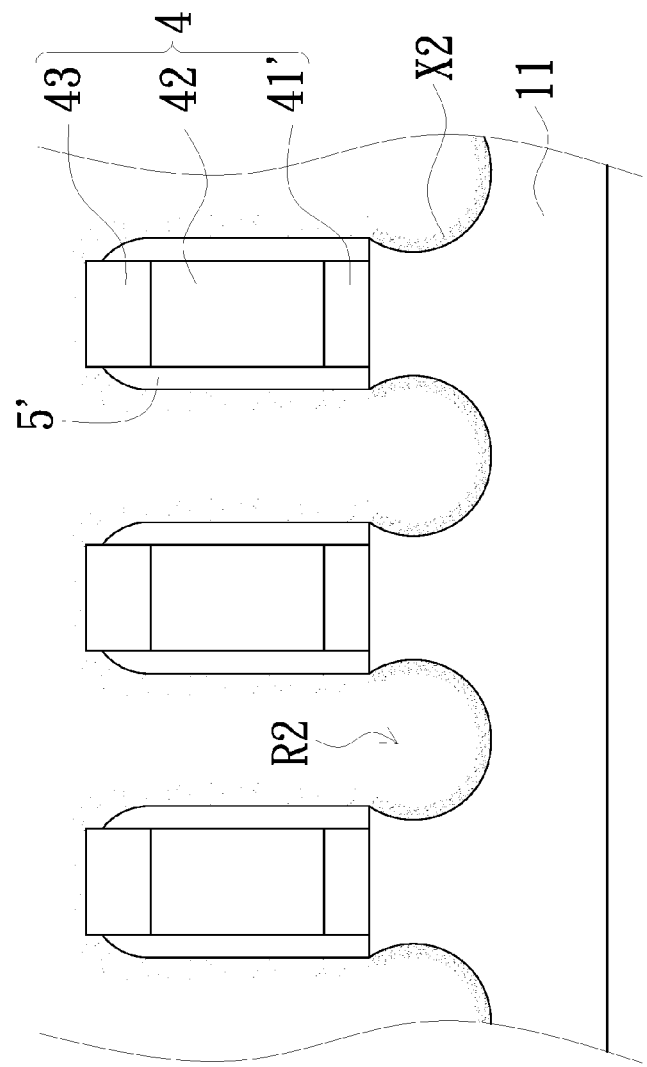
FIGS. 3a-3c are cross-sectional views of different steps along line b-b' in FIG. 3 after the step as shown in FIG. 2c according to an embodiment of the present invention.
Figure 3B:
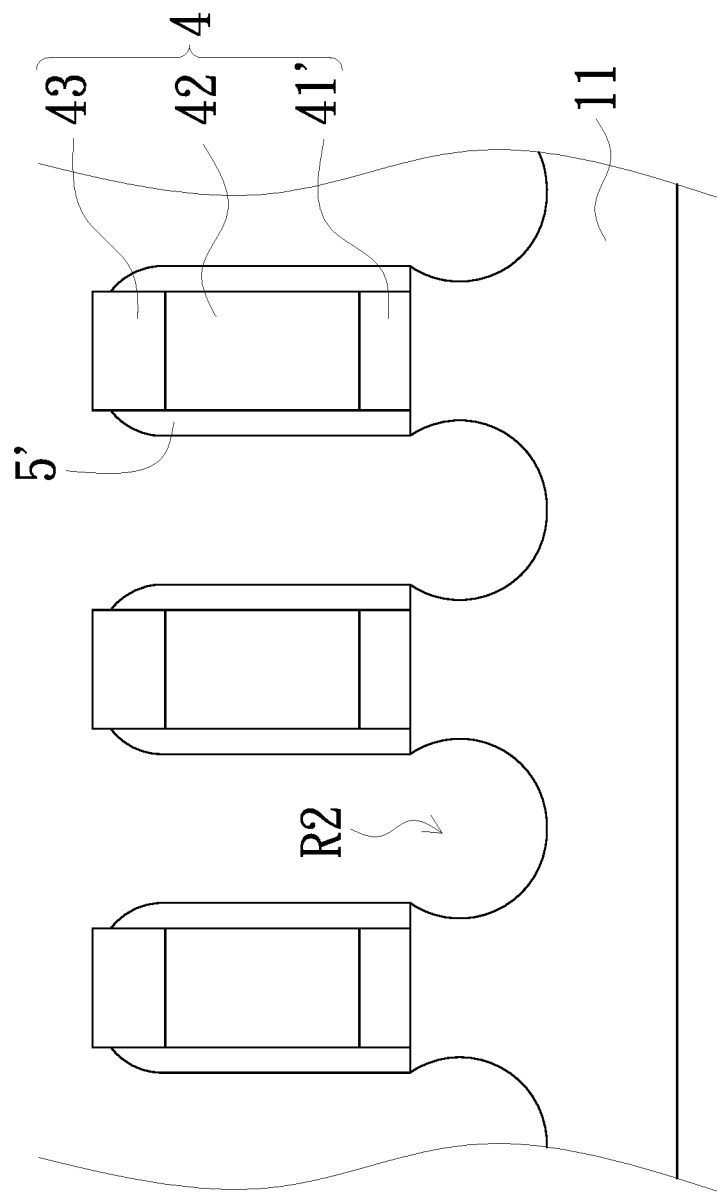
Figure 3C:
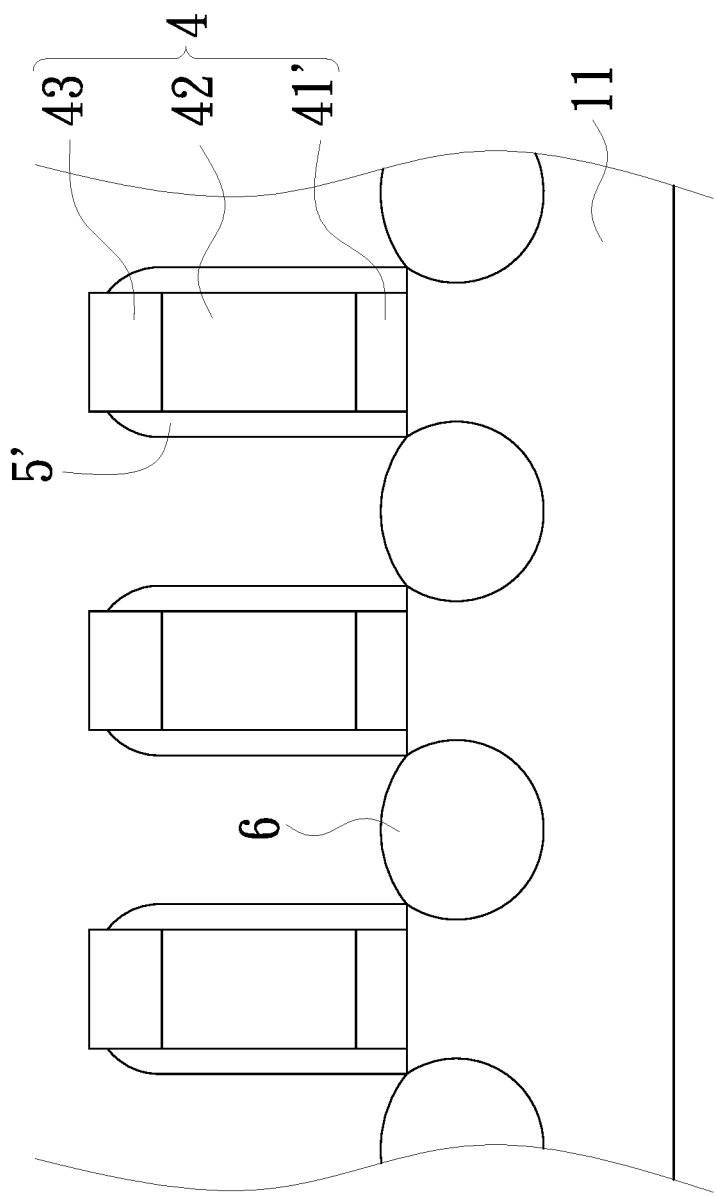

FIGS. 3a-3c are cross sectional views taken along line b-b' in FIG. 3 of the following steps in the fabricating process after the step as shown in FIGS. 2c and 3.

As shown in FIG. 3a, a plurality of recesses R2 are formed by removing a portion of the fin structures 11 at two lateral sides of the gate structures 4. A vertical dry etching process and a lateral dry etching process are performed in sequence to form the plurality of recesses R2 following conventional methods, and details for formation of the recesses R2 are omitted herein for brevity. A horizontal portion of the mask layer 5 is usually entirely removed in the etching processes to form a plurality of spacers 5' on lateral sides of the gate structures 4 as shown in FIG. 3a, and it uses the gate structures 4 and the spacers 5' together as a mask to form the recesses R2. In an embodiment of the present invention, a top portion of the dielectric layer 2' is also removed in during the formation of the recesses R2 (not shown). In an embodiment of the present invention, the spacers 5' is a multi-layer structure having an outermost nitride sub-layer, wherein the nitride sub-layer has a thickness in a range of 50-110 angstroms.

Because of halogen-containing gas used and reactions between silicon and halogen occurred in the etching processes, polymers and halogens (shown as a layer of dots labeled X2 in FIG. 3a, hereinafter called residues X2) are easily attached on the fin structures 11 and the gate structures 4, especially halogens are more easily bonded with the silicon fin structures 11 (FIG. 3a emphasizes the residues X2 on where attaching to the silicon fin structures 11 in the recesses R2). In the fabricating process, source/drain structures are going to grow epitaxially in the recesses R2 later on. However, if the residues X2 remain inside the recesses R2, it leads to bad uniformity of the source/drain structures being formed.

In the present invention, a first cleaning step is performed on the substrate 1 using a cleaning solution selected from one of a third solution and a fourth solution. The third solution of the present invention uses FOM solution, consisting of dHF and $DIO_3$, wherein a weight ratio of the dHF to the $DIO_3$ in the FOM solution is in a range of 1:1~1:10; and the fourth solution of the present invention uses AOM solution, consisting of ammonium hydroxide ($NH_4OH$) and $DIO_3$, wherein a weight ratio of the $NH_4OH$ to the $DIO_3$ in the AOM solution is in a range of 1:1~1:10. The first cleaning step is performed under a temperature condition in a range of 25~90 degree Celsius with a duration time in a range of 5~120 seconds. The cleaning solution used in the first cleaning step is optionally to include the SC1 solution (i.e. the cleaning solution used in conventional SC1 cleaning process).

Residues X2, especially polymers in the recesses R2 on the fin structures 11, can be effectively removed with a very limited removal rate to the fin structures 11 and the spacer 5. In an embodiment of the present invention, a thickness of the fin structures 11 of the substrate 1 is reduced by less than 100 angstroms and a thickness reduction on the spacer 5' is very limited. In a preferred embodiment, a thickness of the substrate 1 is reduced by less than 50 angstroms; and a thickness of the spacer 5' is reduced by less than 30 angstroms when the spacers 5' or the outer sub-layer of the spacers 5' is made of nitride. Moreover, due to characteristics of the cleaning solution of the first cleaning step, when the fin structures 11 is made of silicon, a light oxidation occurred on the surface of the fin structures 11 embedding all possible remaining halogens due to bonding with silicon on the fin structures 11 inside the recesses R2. Thus, a second cleaning step using a SC1 solution is optionally performed to effectively remove halogen-embedded-oxide (not shown) after the first cleaning step, and residues X2 are effectively removed as shown in FIG. 3b with very limited damage and well-controlled loss amount of the fin structures 11.

Figure 4:
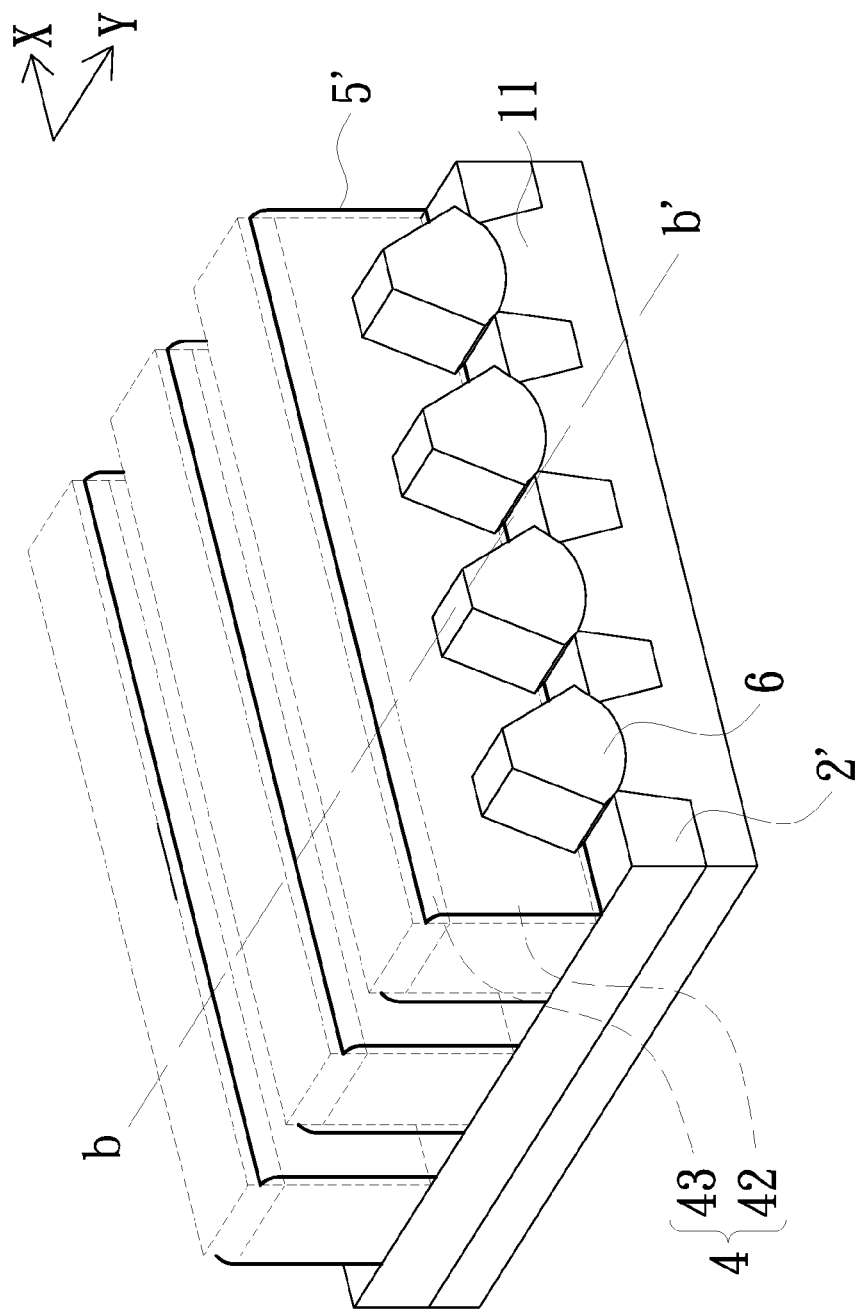
FIG. 4 is a top structural view of the structure as shown in FIG. 3c.

Then as shown in FIG. 3c, a plurality of source/drain structures 6 are epitaxially grown in the recesses R2 using conventional methods, which are omitted from the figures and description in the specification for purpose of brevity. Relative positions and extending directions of the fin structures 11, the gate structures 4, and source/drain structures 6 are more clearly illustrated in FIG. 4, which is a top structural view of the FinFET structure as shown in FIG. 3c.

Therefore, the present invention provides a fabricating method of a FinFET including an improved cleaning process before gate oxide formation, which can effectively remove particles/residues from the previous process and at the same time has very limited removal rate to the materials of the substrate and/or materials formed on the substrate, and at the same time, a precursor oxide can also be formed in the same cleaning process that not only provides better uniformity of the gate oxide formed thereof but also avoid another pre-cleaning step. Moreover, the present invention also provides another improved cleaning process (i.e. the first and the second cleaning steps) before the formation of the source/drain structures that not just provides better cleaning result (especially with better removal efficiency to polymer and halogen residues) but also minimizes loss amount of silicon substrate and nitride spacers, and therefore it provides better product yields. The two cleaning processes can be used alone to have an improved result or together to improve product yields and lower down fabrication and material cost.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fabricating method of a fin field effect transistor (FinFET), comprising:
   providing a substrate;
   forming a plurality of fin structures by removing a portion of the substrate;
   depositing a dielectric layer on the substrate filling between the fin structures;
   forming a plurality of recesses to reveal a portion of the fin structure by removing a first portion of the dielectric layer;
   performing a cleaning process on the fin structures and the dielectric layer using a cleaning solution selected from one of a first solution and a second solution, wherein the first solution consists of dilute hydrogen fluoride and hydrogen peroxide and the second solution consists of dilute hydrogen fluoride and ozonated deionized water;
   forming a gate structure on the fin structures, wherein an extending direction of the gate structure is perpendicular to an extending direction of the fin structures; and
   forming a source/drain structure on the substrate at two lateral sides of the gate structure.

2. The fabricating method of a fin field effect transistor (FinFET) according to claim 1, wherein a duration time of the step of performing the cleaning process is in a range of 10~80 seconds.

3. The fabricating method of a fin field effect transistor (FinFET) according to claim 1, wherein the cleaning process removes a second portion of the dielectric layer and a thickness of the dielectric layer is reduced by less than 10 angstroms.

4. The fabricating method of a fin field effect transistor (FinFET) according to claim 1, wherein the dilute hydrogen fluoride in the first solution is 300:1~2000:1 diluted.

5. The fabricating method of a fin field effect transistor (FinFET) according to claim 1, wherein the dilute hydrogen fluoride in the second solution is 300:1~2000:1 diluted.

6. The fabricating method of a fin field effect transistor (FinFET) according to claim 1, wherein a weight ratio of the dilute hydrogen fluoride to the ozonated deionized water in the second solution is in a range of 1:1~1:10.

7. The fabricating method of a fin field effect transistor (FinFET) according to claim 1, wherein a weight ratio of the dilute hydrogen fluoride to the hydrogen peroxide in the first solution is in a range of 1:1~1:10.

8. The fabricating method of a fin field effect transistor (FinFET) according to claim 1, wherein the cleaning process is performed directly after the step of forming the recesses.

9. The fabricating method of a fin field effect transistor (FinFET) according to claim 1, wherein the step of forming the gate structure comprises:
   directly after the cleaning process, forming a gate oxide covering the fin structures;
   forming a gate electrode on the gate oxide; and
   patterning the gate oxide and the gate electrode into the gate structures.

10. The fabricating method of a fin field effect transistor (FinFET) according to claim 1, wherein a precursor oxide is formed on the fin structures in the cleaning process.

11. A fabricating method of a fin field effect transistor (FinFET), comprising:
    providing a substrate;
    forming a plurality of fin structures by removing a portion of the substrate;
    forming a gate structure on the fin structure, wherein an extending direction of the gate structure is perpendicular to an extending direction of the fin structures;
    forming a plurality of recesses by removing a portion of the fin structures at two lateral sides of the gate structure;
    performing a first cleaning step on the substrate, using a cleaning solution having selected from one of a third solution and a fourth solution, wherein the third solution consists of dilute hydrogen fluoride and ozonated deionized water, and the fourth solution consists of ammonium hydroxide and ozonated deionized water; and
    forming a source/drain structures in the source/drain recesses by epitaxial growth.

12. The fabricating method of a fin field effect transistor (FinFET) according to claim 11, wherein a duration time of the step of the first cleaning step is in a range of 5~120 seconds.

13. The fabricating method of a fin field effect transistor (FinFET) according to claim 11, after the step of forming the gate structure before the step of forming the plurality of recesses, the method further comprises:
    forming a mask layer conformally covering the fin structures and the gate structures.

14. The fabricating method of a fin field effect transistor (FinFET) according to claim 13, wherein a portion of the mask layer is removed in the step of forming the plurality of recesses to form a spacer on lateral sides of the gate structure.

15. The fabricating method of a fin field effect transistor (FinFET) according to claim 14, wherein a portion of the spacer is removed in the step of performing the first cleaning step, and a thickness of the substrate is reduced by less than 100 angstroms.

16. The fabricating method of a fin field effect transistor (FinFET) according to claim 11, wherein a portion of the substrate is removed in the step of performing the first cleaning step, and a thickness of the substrate is reduced by less than 30 angstroms.

17. The fabricating method of a fin field effect transistor (FinFET) according to claim 11, after the first cleaning step before the step of forming a source/drain structures, the method further comprises:

performing a second cleaning step using a SC1 solution.

18. The fabricating method of a fin field effect transistor (FinFET) according to claim 11, wherein a weight ratio of the dilute hydrogen fluoride to the ozonated deionized water in the third solution is in a range of 1:1~1:10.

19. The fabricating method of a fin field effect transistor (FinFET) according to claim 11, wherein a weight ratio of the ammonium hydroxide to the ozonated deionized water in the fourth solution is in a range of 1:1~1:10.

20. The fabricating method of a fin field effect transistor (FinFET) according to claim 11, wherein the first cleaning step is performed under a temperature condition in a range of 25~90 degree Celsius.

* * * * *